United States Patent [19]

Joshima et al.

[11] Patent Number: 5,076,902

[45] Date of Patent: Dec. 31, 1991

[54] ELECTROLYSIS APPARATUS

[75] Inventors: Nobuyuki Joshima; Yasumi Sasaki; Shigeru Abe, all of Ogunimachi, Japan

[73] Assignee: Toshiba Ceramics Co., Ltd., Tokyo, Japan

[21] Appl. No.: 291,592

[22] Filed: Dec. 29, 1988

[51] Int. Cl.⁵ .......................... C25C 5/00; C25B 15/00
[52] U.S. Cl. ................................ 204/241; 204/243 R; 204/246; 204/272; 204/286; 204/294; 204/297 R
[58] Field of Search .................... 204/241, 243 R–247, 204/130, 272, 294, 297 R, 286

[56] References Cited

U.S. PATENT DOCUMENTS

| | | | |
|---|---|---|---|
| 1,299,947 | 4/1919 | Ingeberg | 204/247 X |
| 2,952,591 | 9/1960 | Finn, Jr. et al. | 204/246 X |
| 3,405,043 | 10/1968 | Barakat et al. | 204/60 |
| 3,440,153 | 4/1969 | Arnoldi et al. | 204/60 |
| 3,486,995 | 12/1969 | Evers | 204/60 X |
| 4,377,347 | 3/1983 | Hanmyo et al. | 373/136 X |
| 4,869,790 | 9/1989 | Charles et al. | 204/243 R X |

*Primary Examiner*—Donald R. Valentine
*Attorney, Agent, or Firm*—Ronald P. Kananen

[57] ABSTRACT

An electrolysis apparatus has a furnace for setting a silica glass component such as a process tube or crucible, a heater for heating the component, a sensor for measuring a temperature of an inside portion of the furnace, an anode and an cathode for applying a voltage across the component so as to electrolyze the component, a tube for holding the anode, a device for supplying an inert gas into a space between the anode and the holding tube, and a DC power source connected to the anode and the cathode.

17 Claims, 3 Drawing Sheets

ELECTROLYSIS APPARATUS

BACKGROUND OF THE INVENTION

The present invention relates to an electrolysis apparatus for a component made of vitreous silica or silica glass.

Examples of a component made of silica glass are a process tube and a crucible for producing a silicon single crystal. Such a component is manufactured by electric fusion of quartz crystal powder obtained from finely pulverized natural rock crystal.

In order to produce a high density of integrated circuits, silicon single crystals of higher quality must be manufactured in the semiconductor industry The quality of silicon single crystals is seriously affected by impurities, for example, alkali metals such as Na, K and Li, and copper.

SUMMARY OF THE INVENTION

The object of the present invention is to provide an electrolysis apparatus which can efficiently remove impurities from a vitreous silica or silica glass component.

According to the present invention, an electrolysis apparatus comprises a furnace for setting therein a component made of silica glass or vitreous silica, means for heating the component set in the furnace, an anode and a cathode for applying a predetermined voltage across the component for the electrolysis purpose when the component is held in position between the anode and the cathode so that the component can be electrolysed in the furnace.

According to a preferred embodiment of the present invention, an electrolysis apparatus includes a furnace, a heater for heating a silica glass component in the furnace, a temperature measuring means for measuring temperatures of an predetermined portion of the furnace, an anode and a cathode coaxially arranged in a vertical direction for applying a voltage across the silica glass component for the electrolysis purpose, a holding tube attached to the furnace for holding the anode and/or cathode, and means for supplying an inert gas to a space between the anode and/or cathode and the holding tube.

It is preferable that the anode is supported by the holding tube in such a manner that the inert gas can flow through a space between the anode and the holding tube. A DC power source is connected to the anode and the cathode.

Preferably, a silica glass component is placed between a cathode plate and an anode plate which are joined to the cathode and an anode, respectively. For example, a pair of flat plates are arranged in a parallel relationship. In case the component is in the shape of a crucible, a flat cathode plate can be used in combination with a crucible-shaped anode plate.

When the electrolysis apparatus is in operation, a high voltage is applied across the silica glass component between the anode and the cathode so that the component can be electrolysed. During electrolysis, the furnace is heated at 1,000° C. or above by the heater. Also, the inert gas is supplied at a prescribed flow rate into space between the anode and the holding tube from the inert gas supply means so as to ensure insulation between the anode and the holding tube.

The impurities such as alkali metals and copper contained in the silica glass component are shifted toward the cathode.

Preferably, a predetermined amount of quartz glass powder is placed between the component and the cathode plate. Also, a predetermined amount of carbon powder is placed between the component and the anode plate. It is not necessary to change the shape of the anode and/or cathode even if a silica glass component has a complex shape like a crucible. In such a case, the quartz glass powder traps the impurities contained in the component.

A silica glass component made from a silica glass raw material by a rotary melting method can be set in the furnace such that an unmelted part is in contact with the cathode plate and the other part is in contact with the anode plate. Carbon felts are interposed between the electrodes and the silica glass component. The silica glass component is heated at 1,000° C. or above while a high voltage is applied across the component. The electrolysis of the silica glass component shifts metallic impurities such as alkali metals and copper contained in the silica glass component toward the unmelted part at the cathode plate so that the impurities can be trapped by the unmelted part. After electrolysis, the unmelted part is removed by grinding or the like.

A cathode is preferably placed in a holding tube so that an inert gas can be supplied at a prescribed flow rate into a space between the holding tube and the cathode from an inert gas supply means.

According to the present invention, impurities can be effectively removed from a silica glass component by electrolysis.

The inert gas prevents the electric current from flowing between the electrodes and the furnace.

If a temperature measuring means includes in combination a protecting tube and a thermocouple inserted in the protecting tube, the thermocouple is not exposed in the furnace so that discharge does not occur at the thermocouple. Thus, the thermocouple is exempted from damage by discharge, which leads to efficient electrolysis.

If the furnace is constructed of silica bricks containing more than 20 wt. % of $SiO_2$, the bricks keep alkali metals therein and prevent alkali metals from entering the inside space of the furnace. Thus, divitrification of the silica glass component can be prevented from being electrolyzed.

DETAILED DESCRIPTION OF THE PREFERRED EMBODIMENTS

Figure 1:
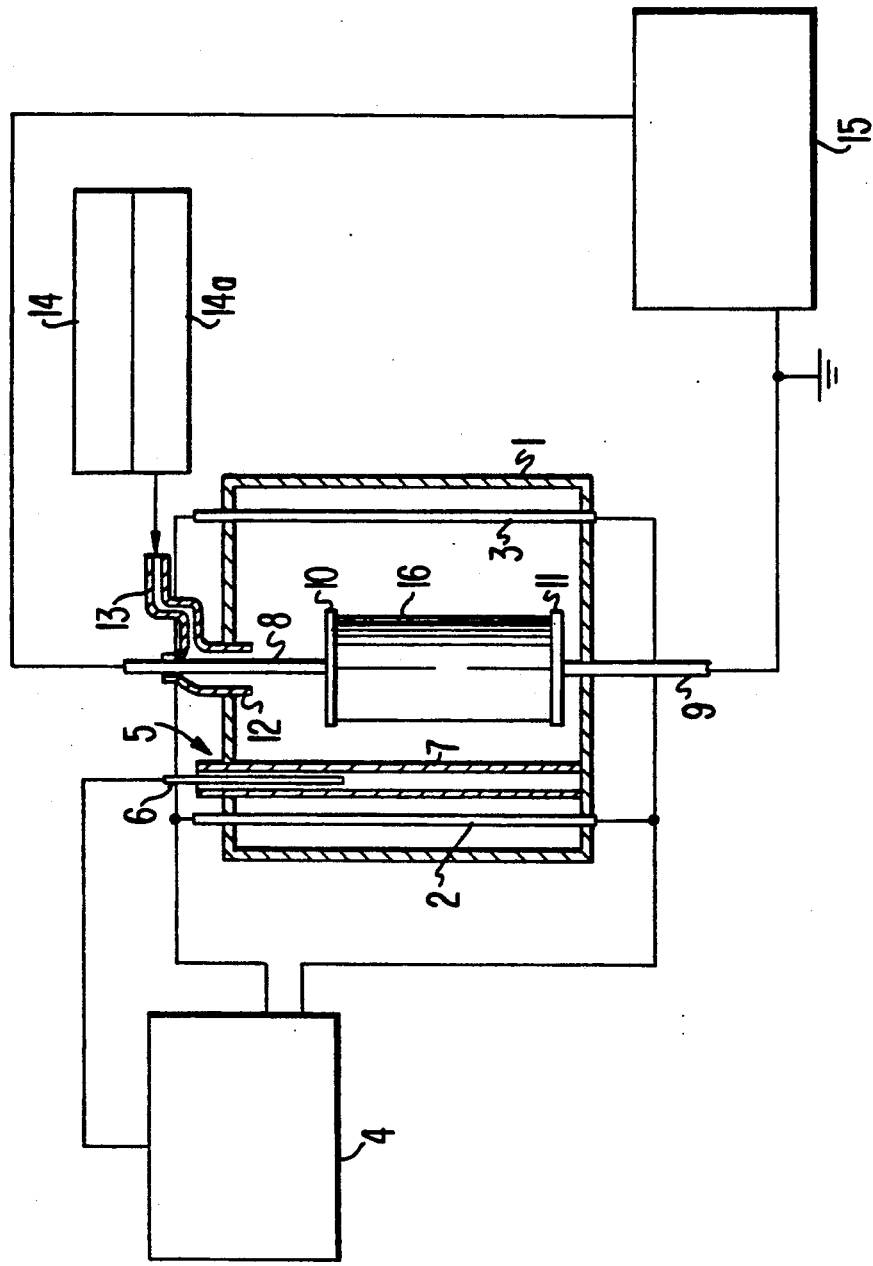
FIG. 1 is a schematic view showing an electrolysis apparatus according to an embodiment of the present invention.

Referring to FIG. 1, the reference numeral 1 denotes a furnace including a casing and an insulation material for covering the inside wall of the casing. A component 16 made of silica glass or vitreous silica in a cylindrical shape is set in position between a pair of electrode plates 10, 11 which are joined to a rod-shaped anode 8 and a rod-shaped cathode 9, respectively. Heaters 2, 3 made of silicon carbide are arranged in the furnace 1 for heating the component 16 placed between the electrode plates 10, 11. The upper and lower ends of the heaters 2, 3 extend outwards from the furnace 1 in a vertical direction and are connected to a temperature control means 4 which can be conventional.

A temperature measuring means 5 is placed in the furnace 1 so as to measure temperatures of a predetermined portion of the furnace 1. An example of the temperature measuring means 5 includes in combination a thermocouple 6 and a protective tube 7 made of silicon carbide. The protective tube 7 is inserted in the furnace 1 so as to cover the thermocouple 6. The upper end of the protecting tube 7 projects upwards from the top of the furnace 1. The lower end of the protecting tube 7 reaches the bottom of the furnace 1. The thermocouple 6 is electrically connected to the temperature control means 4. The inside of the furnace 1 is heated by the heaters 2, 3. The thermocouple 6 detects the furnace temperatures so as to send temperature signals to the temperature control means 4 so that the furnace 1 can be kept at 1,000° C. or more.

As the protecting tube 7 protects the thermocouple 6, no discharge takes place at a lower end of the thermocouple 6 although some discharge could occur if the thermocouple 6 is not protected by the protecting tube 7 in the furnace 1. In other words, it does not induce discharge in a high-temperature, high-voltage atmosphere of the furnace 1.

The anode 8 and the cathode 9 are made of carbon. They are arranged coaxially in a vertical direction. The anode 8 is joined to the anode plate 10. The cathode 9 is joined to the cathode plate 11. The plates 10, 11 are parallel to each other in a horizontal direction. The silica glass component 16 can be held between them. In other words, as best shown in FIG. 1, the anode plate 10 is in contact with the upper end of the silica glass component 16 while the cathode plate 11 is in contact with the lower end of the silica glass component 16.

A cap-shaped holding tube 12 is fixed to a top portion of the furnace 1. The anode 8 extends upwardly in and passes through the holding tube 12. The anode 8 is held by the holding tube 12 through a supporting means made of an insulation material although not specifically shown. The cathode 9 is supported by the bottom of the furnace through an insulating material.

The holding tube 12 is connected via a gas blowing tube 13 to a means 14a, such as a flowmeter, for controlling a flow rate of inert gas to be supplied from an inert gas supply means 14 into the gas blowing tube 13. The inert gas supply means 14 contains a predetermined amount of inert gas such as nitrogen gas. An example of the controlling means 14a is a flowmeter. The inert gas can be fed at a flow rate of 10 to 15 mm/sec.

The anode 8 and the cathode 9 are connected to a DC power source 15 having a capacity of 20 kV and 200 mA.

An example of the silica glass component 16 is a process tube.

In operation, the component 16 is placed between the anode plate 10 and the cathode plate 11 and then heated at 1,000° C. or above by the heaters 2, 3 in the furnace 1. Also, a DC voltage of 1 to 10 kV is applied for 3 hours or more across the electrode plates 10, 11 so as to carry out electrolysis of the component 16, thereby shifting the impurities contained in the component 16 toward the cathode plate 11. Examples of the impurities are alkali metals (Li, K and Na) and copper.

After the complete electrolysis of the component, it is desired to cut an end portion of the component 16 which has been positioned at the cathode plate 11 because such an end portion contains the shifted and collected impurities.

During the above-mentioned operation, the inert gas is continuously supplied at a flow rate of 10 to 15 mm/sec via the gas blowing tube 13 and the holding tube 12 into the furnace 1 along the anode 8. The inert gas not only cools the holding tube 12 so as to be maintained at about 400° C. but also ensures insulation between the holding tube 12 and the anode 8 so as to obtain an insulation resistance of about $10^8$ ohm-cm.

If the flow rate of the inert gas is lower than 10 mm/sec, the holding tube 12 is likely to be not sufficiently cooled and the insulation of the holding tube 12 may be poor. If the flow rate is higher than 15 mm/sec, the anode 8 and the upper part of the component 16 are cooled too much, which decreases the efficiency of electrolysis.

When the inert gas flows between the anode 8 and the holding tube 12, the insulation is improved so as to avoid perfectly the electric current flowing between the holding tube 12 and the furnace 1. Thus the overall insulation of the furnace 1 is ensured so as to avoid any current leakage by accident, resulting in efficient electrolysis of the component 16.

Although a high voltage is applied across the component between the anode 8 and the cathode 9 during electrolysis, any discharge does not take place at the lower end of the thermocouple 6 because the thermocouple 6 is protected by the protecting tube 7.

Figure 2:
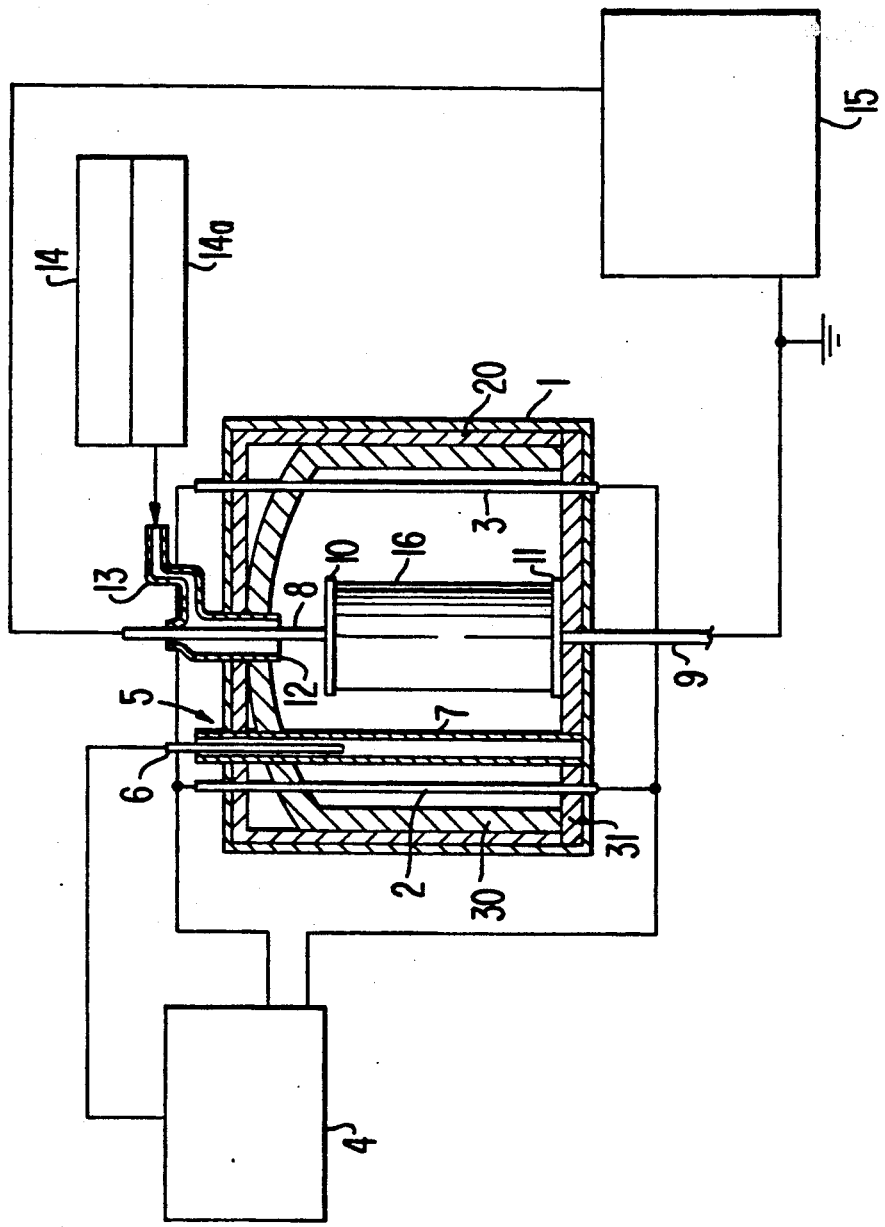
FIG. 2 is a schematic view showing an electrolysis apparatus according to a further embodiment of the present invention.

FIG. 2 shows a further embodiment of the present invention. The structure of an electrolysis apparatus shown in FIG. 2 is substantially the same as that shown in FIG. 1 except insulation materials 20, 30 and 31. Therefore, the like referance characters designate like or corresponding parts. They are not explained.

In FIG. 2, the furnace 1 has the insulation materials 20, 30 and 31. The insulation material 30 is fixed to the insulation material 20. The insulation material 31 is attached to the bottom of the furnace 1 such that they surround the component 16. The insulating material 20 is made of fiber glass or the like. The insulation materials 30, 31 are made of silica-alumina bricks which contain 20 wt. % or more of $SiO_2$. If $SiO_2$ is less than 20 wt. %, the silica-alumina bricks are apt to liberate alkali metals, resulting in devitrification of the component 16. Silica-alumina (mullite) bricks containing about 28 wt. % of $SiO_2$ hold alkali metals therein and do not contaminate the furnace 1 with the alkali metals. Therefore, the component 16 may be exempt from devitrification.

The silica-alumina bricks keep alkali metals on account of $SiO_2$ contained therein. Therefore, they prevent the furnace 1 from being contaminated with the alkali metals, and the component 16 may be exempted from devitrification.

On the other hand, in FIGS. 1 and 2, a predetermined amount of glass powder such as quartz glass powder can be interposed between the lower end of the component 16 and the cathode plate 11 prior to electrolysis in the shape of a layer having a thickness of preferably 5 to 20 mm. If the layer is thinner than 5 mm, a cathode-side portion of the component may be devitrified. Conversely, if the layer is thicker than 20 mm, it may have an excessively high electric resistance, which prolongs the time required for electrolysis. When the component 16 is heated at 1,000° C. or above while a high voltage is applied across the component between the electrodes 8 and 9, the impurities contained in the component 16 move toward the cathode plate 11 so that they can be trapped by the glass powder positioned between the cathode plate 11 and the component 16. Consequently, the component 16 as a whole becomes highly pure. It can be used entirely as a final product. This eliminates waste.

Figure 3:
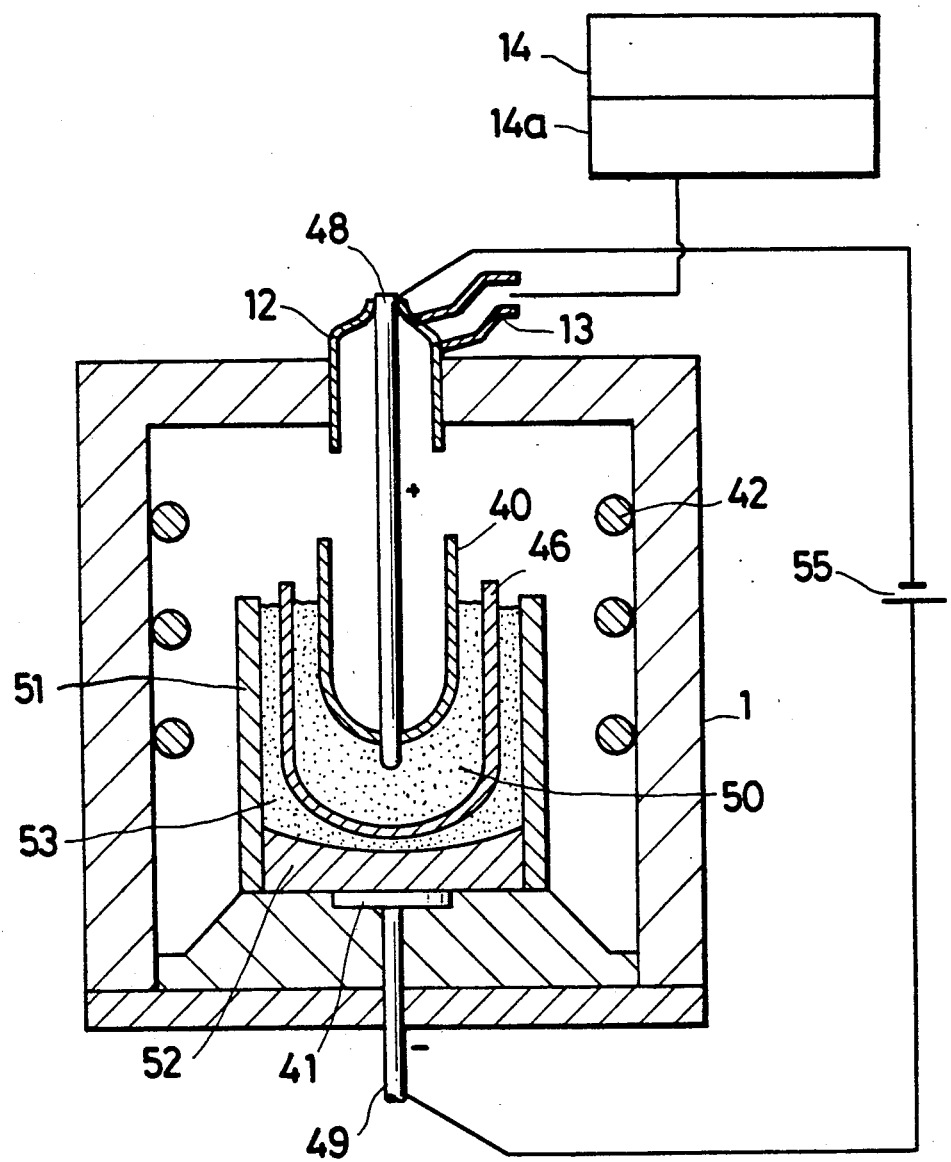
FIG. 3 is a schematic view showing an electrolysis apparatus according to still another embodiment of the present invention.

FIG. 3 shows another embodiment of the present invention. A component 46 is made of silica glass or vitreous silica in a crucible shape. A starting material is finely grained powder produced from natural rock crystals. A preferred powder has an average particle diameter of 100 to 200 microns. After the powder is subject to a deironation treatment, the powder is purified by flotation and then further purified by dipping in 10% hydrofluoric acid at 50° C. or above for 20 hours. The purified powder is shaped into a crucible by a rotary melting method. The component 46 is set in position between a pair of electrode plates 40, 41 which are joined to an anode 48 and a cathode 49, respectively. The electrode plate 41 is flat while the other electrode plate 40 is formed in the shape of a crucible as a core. A spiral or coil-shaped heater 42 made of silicon carbide is arranged in the furnace 1 for heating the component 46 placed between the electrode plates 40, 41. The heater 42 is connected to the temperature control means 4, and the temperature measuring means 5 is placed in the furnace 1 so as to measure temperatures of a predetermined portion of the furnace 1 although not shown in FIG. 3.

The anode 48 and the cathode 49 are made of carbon. They are arranged coaxially in a vertical direction. The anode 48 slightly passes through and is fixed to a bottom portion of the anode plate 40. The cathode 49 is joined to the cathode plate 41. The anode plate 40 is placed inside of the component 46. The space between the anode plate 40 and the component 46 is filled with carbon powder 50 having an average particle size of 5 to 40 microns. A cylindrical main die 51 and a disk-shaped bottom die 52 are made of carbon or silicon carbide and set on a bottom portion of the furnace 1 in the shape of a cup. The component 46 is positioned inside the main die 51 in such a manner that the space between the dies 51, 52 and the component 46 is filled with quartz glass powder 53. The cathode plate 41 is placed between the bottom die 52 and the bottom portion of the furnace 1 under the component 46 in such a way that the cathode plate 41 and the cathode 49 are electrically insulated from the furnace.

The glass powder layer 53 preferably has a thickness ranging between 5 and 30 mm.

The cap-shaped holding tube 12, the gas blowing tube 13, the inert gas supply means 14 and the flow-rate control means 14a are arranged as in FIG. 1 and function in the same manner. The anode 48 and the cathode 49 are connected to a DC power source 55 having a capacity of 1.5 kV and 200 mA.

In operation, the crucible-shaped component 46 positioned between the anode plate 40 and the cathode plate 41 is heated at 1,200° C. by the heater 42 in the furnace 1 while a DC voltage of 1.5 KV is applied across the component between the electrodes 48, 49 for 45 minutes or more so as to carry out electrolysis of the component 46, thereby shifting the impurities contained in the component 46 toward the quartz glass powder 53 until the impurities can be sufficiently trapped thereby.

During the operation, the inert gas is continuously supplied in the above-stated manner.

The present invention is not limited to the above-mentioned embodiments. The silica glass component 16 is not limited to a crucible or a process tube. The temperature measuring means may be any other measuring device. The heater may be manually controlled by an operator.

We claim:

1. An electrolysis apparatus comprising a furnace for setting therein a component made of silica glass or vitreous silica and which includes insulating means for surrounding the component when set in the furnace; a heater for heating the component when set in the furnace; an anode and a cathode for applying a predetermined voltage across the component for electrolysis of the component; means for holding the anode and the cathode; and a power source connected to the anode and the cathode so as to apply a voltage across the component when the component is held in position between the anode and the cathode so that the component can be electrolyzed in the furnace; and wherein the insulating means includes silica-alumina bricks containing at least 20 wt % of $SiO_2$.

2. An electrolysis apparatus as claimed in claim 1, wherein the anode is joined to an anode plate and the cathode is joined to a cathode plate and wherein the component is adapted to be held in position between the cathode plate and the anode plate for the electrolysis purpose.

3. An electrolysis apparatus as claimed in claim 2, wherein the anode plate and the cathode plate are flat and arranged in a parallel relationship.

4. An electrolysis apparatus as claimed in claim 2, wherein the cathode plate is flat and the anode plate is formed in the shape of a crucible.

5. An electrolysis apparatus as claimed in claim 4, further comprising a die means made of carbon or silicon carbide, the die means being connected to the cathode plate, the anode plate being placed inside the die means.

6. An electrolysis apparatus as claimed in claim 1, wherein the anode and the cathode are coaxially arranged in a vertical direction.

7. An electrolysis apparatus as claimed in claim 1, wherein the holding means includes a holding tube attached to the furnace for holding the anode.

8. An electrolysis apparatus as claimed in claim 7, further comprising means for supplying an inert gas into a space between the anode and the holding tube.

9. An electrolysis apparatus as claimed in claim 1, further comprising means for supplying an inert gas into a space between the anode and the holding means.

10. An electrolysis apparatus as claimed in claim 9, further comprising means for controlling a flow rate of the inert gas to be supplied.

11. An electrolysis apparatus as claimed in claim 1, wherein the anode and the cathode are made of carbon.

12. An electrolysis apparatus comprising a furnace for setting therein a component made of silica glass or vitreous silica; a heater for heating the component set in the furnace; an anode and a cathode for applying a predetermined voltage across the component for electrolysis of the component wherein the anode is joined to an anode plate and the cathode is joined to a cathode plate and wherein the component is adapted to be held in position between the cathode plate and the anode plate for electrolysis; a power source connected to the anode and the cathode so as to apply a voltage across the component when the component is held in position between the anode and the cathode so that the component can be electrolyzed in the furnace; and wherein glass powder is interposed between the component and the cathode plate.

13. An electrolysis apparatus as claimed in claim 12, wherein the glass powder constitutes a layer having a thickness of 5 to 20 mm.

14. An electrolysis apparatus comprising a furnace for setting therein a component made of silica glass or vitreous silica; a heater for heating the component set in the furnace; an anode and a cathode for applying a predetermined voltage across the component for electrolysis of the component; means for holding the anode and the cathode; a power source connected to the anode and the cathode so as to apply a voltage across the component when the component is held in position between the anode and the cathode so that the component can be electrolyzed in the furnace wherein the holding means includes a holding tube in which the cathode extends in such a manner that the cathode is supported by the holding tube.

15. An electrolysis apparatus comprising a furnace for setting therein a component made of silica glass or vitreous silica; a heater for heating the component set in the furnace; an node and a cathode for applying a predetermined voltage across the component for electrolysis of the component; means for holding the anode and the cathode; a power source connected to the anode and the cathode so as to apply a voltage across the component when the component is held in position between the anode and the cathode so that the component can be electrolyzed in the furnace wherein the holding means includes a holding tube in which the anode extends in such a manner that the anode is supported by the holding tube.

16. An electrolysis apparatus comprising a furnace for setting therein a component made of silica glass or vitreous silica; a heater for heating the component when set in the furnace; an anode and a cathode for applying a predetermined voltage across the component for electrolysis of the component wherein an anode is joined to an anode plate and a cathode is joined to a cathode plate and wherein the component is adapted to be held in position between the cathode plate and the anode plate for electrolysis; and wherein the cathode plate is flat and the anode plate is formed in the shape of a crucible; means for holding the anode and the cathode; a power source connected to the anode and the cathode so as to apply a voltage across the component when the component is held in position between the anode and the cathode so that the component can be electrolyzed in the furnace; and wherein a carbon powder layer is interposed between the anode plate and the component.

17. An electrolysis apparatus comprising a furnace for setting therein a component made of silica glass or vitreous silica; a heater for heating the component set in the furnace; an anode and a cathode for applying a predetermined voltage across the component for electrolysis of the component wherein an anode is joined to an anode plate and a cathode is joined to a cathode plate and wherein the component is adapted to held in position between the cathode plate and the anode plate for electrolysis; means for holding the anode and the cathode; a power source connected to the anode and the cathode so as to apply a voltage across the component when the component is held in position between the anode and the cathode so that the component can be electrolyzed in the furnace; and wherein a carbon felt is interposed between the component and the anode or cathode.

* * * * *